(12) United States Patent
Kim et al.

(10) Patent No.: US 11,271,091 B2
(45) Date of Patent: Mar. 8, 2022

(54) FIN STRUCTURE FOR VERTICAL FIELD EFFECT TRANSISTOR HAVING TWO-DIMENSIONAL SHAPE IN PLAN VIEW

(71) Applicant: SAMSUNG ELECTRONICS CO., LTD., Suwon-si (KR)

(72) Inventors: Seon Bae Kim, Suwon-si (KR); Seung Hyun Song, Suwon-si (KR); Ki Il Kim, Suwon-si (KR); Young Chai Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 184 days.

(21) Appl. No.: 16/775,550

(22) Filed: Jan. 29, 2020

(65) Prior Publication Data

US 2020/0403086 A1  Dec. 24, 2020

Related U.S. Application Data

(60) Provisional application No. 62/862,829, filed on Jun. 18, 2019.

(51) Int. Cl.
| | | |
|---|---|---|
| *H01L 21/8234* | (2006.01) | |
| *H01L 29/66* | (2006.01) | |
| *H01L 21/28* | (2006.01) | |
| *H01L 29/06* | (2006.01) | |
| *H01L 29/78* | (2006.01) | |

(52) U.S. Cl.
CPC .. *H01L 29/66666* (2013.01); *H01L 21/28194* (2013.01); *H01L 21/823468* (2013.01); *H01L 29/0692* (2013.01); *H01L 29/66795* (2013.01); *H01L 29/7827* (2013.01); *H01L 29/7854* (2013.01)

(58) Field of Classification Search
CPC ....... H01L 21/823487; H01L 29/66666; H01L 29/7827
See application file for complete search history.

(56) References Cited

U.S. PATENT DOCUMENTS

| | | |
|---|---|---|
| 8,110,466 B2 | 2/2012 | Shieh et al. |
| 8,617,937 B2 | 12/2013 | Cheng et al. |
| 9,129,839 B2 | 9/2015 | Shieh et al. |
| 9,324,619 B2 | 4/2016 | Baek et al. |
| 9,589,848 B2 | 3/2017 | Cheng et al. |
| 9,608,098 B2 | 3/2017 | Shrivastava et al. |

(Continued)

*Primary Examiner* — Mark V Prenty
(74) *Attorney, Agent, or Firm* — Sughrue Mion, PLLC

(57) ABSTRACT

A method for manufacturing a fin structure for a vertical field effect transistor (VFET) includes: forming on a substrate mandrels having at least one first gap therebetween; forming first spacers on side surfaces of the mandrels such that at least one second gap, smaller than the first gap, is formed between the first spacers; forming a second spacer on side surfaces of the first spacers; removing the mandrels and the first spacers to leave the second spacer on the side surfaces of the first spacers; removing the second spacer, on the side surfaces of the first spacers, at a predetermined portion so that the remaining second spacer has a same two-dimensional (2D) shape as the fin structure; and removing a portion of the substrate, except below the remaining second spacer, and the remaining second spacer so that the substrate below the remaining second spacer forms the fin structure.

16 Claims, 17 Drawing Sheets

(56) References Cited

U.S. PATENT DOCUMENTS

| | | |
|---|---|---|
| 9,842,739 B2 | 12/2017 | Cheng et al. |
| 9,846,757 B2 | 12/2017 | Zhuang et al. |
| 9,893,169 B1 | 2/2018 | Cheng et al. |
| 9,964,605 B2 | 5/2018 | Chi et al. |
| 10,014,175 B2 | 7/2018 | Chang et al. |
| 10,068,979 B2 | 9/2018 | Eng et al. |
| 10,256,347 B2 | 4/2019 | Yamazaki |
| 10,340,364 B2 * | 7/2019 | Zhang ................ H01L 29/1037 |
| 2017/0054027 A1 | 2/2017 | Liu |

* cited by examiner

FIN STRUCTURE FOR VERTICAL FIELD EFFECT TRANSISTOR HAVING TWO-DIMENSIONAL SHAPE IN PLAN VIEW

CROSS-REFERENCE TO THE RELATED APPLICATION

This application claims priority from U.S. Provisional Application No. 62/862,829 filed on Jun. 18, 2019 in the U.S. Patent and Trademark Office, the disclosure of which is incorporated herein in its entirety by reference.

BACKGROUND

1. Field

Apparatuses and methods consistent with exemplary embodiments of the inventive concept relate to a fin structure for a vertical field effect transistor (VFET) having a two-dimensional (2D) shape in a plan view, more particularly to, a method for manufacturing the same and a fin structure manufactured by this method.

2. Description of the Related Art

In a VFET, a current flows through a channel formed at a fin structure protruded from a substrate in a vertical direction unlike the related art planar FET or finFET. The vertically protruded fin structure is wrapped by a gate structure, and a bottom source/drain (S/D) region and a top S/D region are formed around at a bottom portion and a top portion of the fin structure, respectively.

Although a VFET device including the VFETs is known as having various advantages including a high-density structure with a reduced size over related-art planar FET devices or finFET devices, a more improved VFET structure and improved methods of manufacturing such VFET structure are required.

SUMMARY

Various embodiments of the inventive concept provide methods for manufacturing a fin structure for a VFET having a 2D shape in a plan view and fin structures for the VFET manufactured by these methods.

According to an aspect of an exemplary embodiment, there is provided a method for manufacturing a fin structure for a VFET, which may include: forming a plurality of mandrels on a substrate, the mandrels having at least one first gap therebetween; forming a plurality of first spacers on side surfaces of the mandrels, respectively, such that at least one second gap, which is smaller than the first gap, is formed between the first spacers; forming a second spacer on side surfaces of the first spacers; removing the mandrels and the first spacers to leave the second spacer formed on the side surfaces of the first spacers; removing the second spacer, formed on the side surfaces of the first spacers, at a predetermined portion so that the remaining second spacer has a same two-dimensional (2D) shape as the fin structure; and removing a portion of the substrate, except below the remaining second spacer, and the remaining second spacer so that the substrate below the remaining second spacer forms the fin structure.

According to another aspect of an exemplary embodiment, there is provided a method for manufacturing a fin structure for a VFET, which may include: forming a plurality of mandrels on a substrate, the mandrels having at least one first gap therebetween; forming a plurality of first spacers on side surfaces of the mandrels, respectively, such that at least one second gap, which is smaller than the first gap, is formed between the first spacers; forming a second spacer on side surfaces of the first spacers; removing the mandrels and the first spacers to leave the second spacer, and removing a portion of the substrate except below the second spacer, using the second spacer as a hard mask layer; and removing the second spacer so that the substrate below the second spacer forms the fin structure.

According to another aspect of an exemplary embodiment, there is provided a fin structure for a VFET having a 2D shape in the plan view, wherein the fin structure includes a plurality straight line portions having a same width.

BRIEF DESCRIPTION OF THE DRAWINGS

The above and other aspects of inventive concepts will become more apparent to those of ordinary skill in the art by describing in detail example embodiments thereof with reference to the accompanying drawings, in which.

DETAILED DESCRIPTION

Figure 1A:
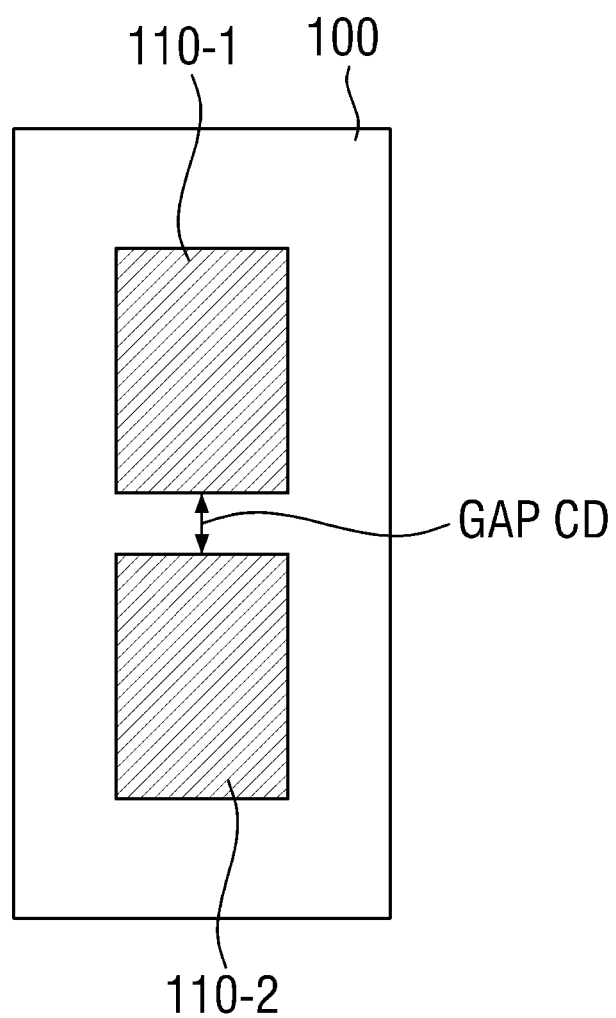
FIGS. 1A through 1E illustrate a method of manufacturing a fin structure for a VFET in the plan view, according to an embodiment.

Various embodiments of the inventive concept will be described more fully hereinafter with reference to the accompanying drawings. These embodiments are all exemplary, and may be embodied in many different forms and should not be construed as limiting the inventive concept. Rather, these embodiments are merely provided so that this disclosure will be thorough and complete, and will fully convey the inventive concept to those skilled in the art. In the drawings, the sizes and relative sizes of the various layers and regions may have been exaggerated for clarity, and thus, the drawings are not necessarily to scale, some features may be exaggerated to show details of particular components or elements. Therefore, specific structural and functional details disclosed herein are not to be interpreted as limiting, but merely as a representative basis for teaching one skilled in the art to variously employ the methods and structures of the embodiments.

An embodiment provided herein is not excluded from being associated with one or more features of another example or another embodiment also provided herein or not provided herein but consistent with the inventive concept. For example, even if matters described in a specific embodiment are not described in a different embodiment, the matters may be understood as being related to or combined with the different embodiment, unless otherwise mentioned in descriptions thereof.

For the purposes of the description hereinafter, the terms "upper", "lower", "top", "bottom", "left," and "right," and derivatives thereof can relate, based on context, to the disclosed structures, as they are oriented in the drawings. The same numbers in different drawings may refer to the same structural component or element thereof.

It will be understood that when an element or layer is referred to as being "on," "connected to" or "coupled to"

another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

As used herein, the term "and/or" includes any and all combinations of one or more of the associated listed items. Expressions such as "at least one of," when preceding a list of elements, modify the entire list of elements and do not modify the individual elements of the list. Thus, for example, both "at least one of A, B, or C" and "A, B, and/or C" means either A, B, C or any combination thereof. Expressions such as "at least one of," when preceding a list of elements, modify the entire list of elements and do not modify the individual elements of the list.

The terminology used herein is for the purpose of describing particular example embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although a fin structure of a VFET is protruded from a substrate, the fin structure may have a one-dimensional (1D) form such as the "1" character or a straight line in a plan view, that is, when viewed from top. Since a factor to determine a performance of the VFET, at least in terms of a size of current path, may be an area of the fin structure of the VFET in the plan view, a fin structure having a two-dimensional (2D) shape in the plan view should have a greater effective fin width ($W_{eff}$) than the 1D-shaped fin because the greater area of the 2D fin structure provides a greater current path between a bottom S/D region and a top S/D region of the VFET.

FIGS. 1A through 1E illustrate a method of manufacturing a fin structure for a VFET in the plan view, according to an embodiment.

Referring to FIG. 1A, a substrate 100 is provided with a pair of mandrels 110-1 and 110-2 formed thereon. Each of the mandrels 110-1 and 110-2 may have a rectangular shape, and may be symmetrically disposed on the substrate 100 such that a short side of the mandrel 110-1 faces a short side of the mandrel 110-2 with a gap having a critical dimension (hereafter "gap CD"). The gap CD represents a width between the two short sides, facing each other, of the mandrels 110-1 and 110-2, and may define a critical dimension of a fin structure to be formed according to the present embodiment.

The shape of each of the mandrels 110-1 and 110-2 may not be limited to the rectangle according to the inventive concept. Also, the two mandrels 110-1 and 110-2 may be symmetrically disposed on the substrate such that the long sides instead of the short sides of the two mandrels 110-1 and 110-2 may face each other, according to an embodiment.

The mandrels 110-1 and 110-2 may be formed on the substrate 100 through lithographing and etching process so that the mandrels 110-1 and 110-2 may have a protrusion shape protruded from the substrate 100, although a cross-sectional view of the substrate 100 with the mandrels 110-1 and 110-2 thereon is omitted herein. However, the inventive concept is not limited thereto, and methods other than the lithographing and the etching may be used to form the mandrels 110-1 and 110-2. Further, there may be provided one or more hard mask layers (not shown) between the substrate 100 and the mandrels 110-1 and 110-2 although not shown in FIGS. 1A through 1E.

The substrate 100 may be formed of a single element semiconductor material such as silicon (Si), germanium (Ge), etc., not being limited thereto, or their compound (SiGe). The substrate 100 may be a doped or undoped layer. The mandrels 110-1 and 110-2 may be formed of a spin-on-hard mask (SOH) material including a silicon-based organic material, not being limited thereto. A variety of different amorphous silicon materials may be used to form the mandrels 110-1 and 110-2 as long as the mandrels 110-1 and 110-2 have etch selectivity with respect to a spacer to be formed on side surfaces, i.e., sidewalls, of the mandrels 110-1 and 110-2 and above the fin structure in following steps of the method according to the present embodiment.

Figure 1B:
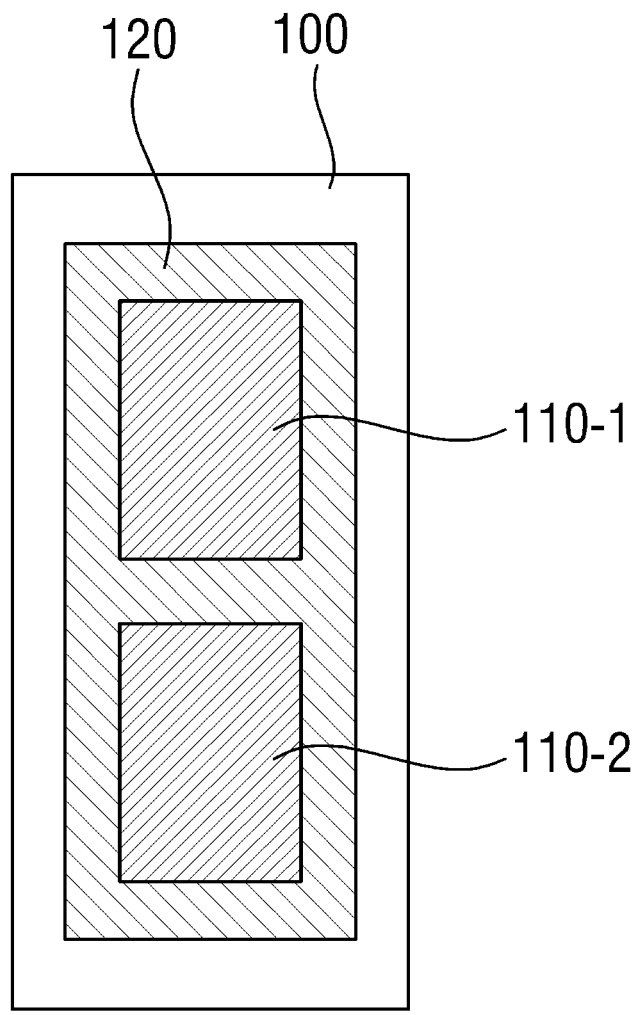

FIG. 1B shows that a spacer 120 is formed on the side surfaces of the mandrels 110-1 and 110-2. FIG. 1B further shows that the spacer 120 fills the gap having the gap CD between the two short sides, facing each other, of the mandrels 110-1 and 110-2 so that the spacer 120 has a connected structure and encloses the mandrels 110-1 and 110-2.

The spacer 120 may be formed by depositing a spacer material such as silicon oxide (SiO) on the mandrels 110-1 and 110-2 to cover top surfaces and the side surfaces thereof, and etching out the spacer material deposited on the top surfaces to expose the top surfaces to the outside and leave the spacer material at the side surfaces of the mandrels 110-1 and 110-2. It is noted here that the spacer material completely fills the gap having the gap CD between the two short sides, facing each other, of the mandrels 110-1 and 110-2.

The process of depositing the spacer material may be performed by a thin film deposition technique such as atomic layer deposition (ALD), not being limited thereto, so that the spacer 120 can have a same width along the side surfaces of the mandrels 110-1 and 110-2, which may a required dimension for a desired fin structure to be formed according to the present embodiment. The etching process used in the present step may be anisotropic etching or plasma etching, not being limited thereto, according to the inventive concept.

The spacer material forming the spacer 120 may also not be limited to SiO as long as the spacer material has etch selectivity with respect to the material forming the mandrels 110-1 and 110-2.

Figure 1C:
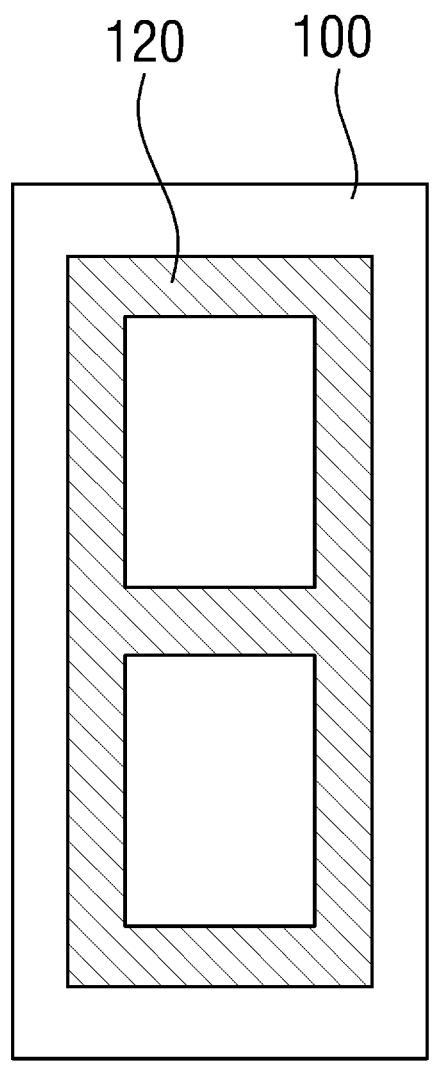

FIG. 1C shows that the mandrels 110-1 and 110-2 enclosed by the spacer 120 are removed by another etching process such as dry etching, not being limited thereto, to leave the spacer 120, formed at the side surfaces of the mandrels 110-1 and 110-2, on the substrate 100.

Figure 1D:
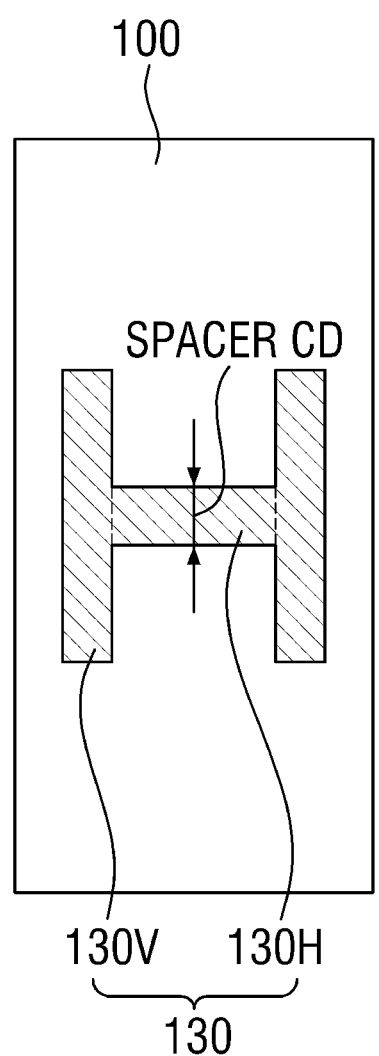

FIG. 1D shows that the spacer 120 is cut or etched out at two opposite sides in a length direction to form an H-shaped spacer 130, that is, a spacer having a shape of character "H" having a desired dimension in the plan view. It is noted here that the gap CD shown in FIG. 1A is transferred to a critical dimension of the H-shaped spacer 130 (hereafter "spacer CD") because of the lithography, deposition and etching processes shown in FIGS. 1A through 1C. The spacer CD of the H-shaped spacer 130 represents a width of a horizontal portion 130H of the H-shaped spacer 130, and may be equal to the gap CD which will define a critical dimension of a fin structure, in the plan view, to be formed in the next step. Further, the width of the horizontal portion 130H of the H-shaped spacer 130 may be equal to a width of a vertical portion 130V of the H-shaped spacer 130.

Figure 1E:
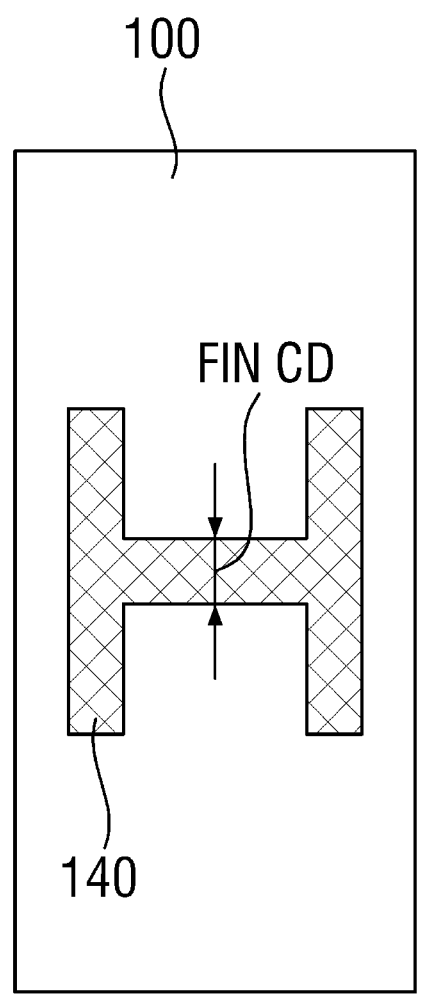

FIG. 1E shows that, using the H-shaped spacer 130 as a hard mask layer, the substrate 100 is etched downward, and the H-shaped spacer 130 is also removed by etching, thereby forming an H-shaped fin structure 140 which is vertical with respect to the substrate 100 and also has a shape of character "H." A bottom S/D region is then formed in the substrate 100 beneath the H-shaped fin structure 140. Here, the spacer CD is transferred to a critical dimension of the H-shaped fin structure 140 (hereafter "fin CD"). Thus, the gap CD shown in FIG. 1A is finally transferred to and define the fin CD. In other words, the fin CD is equal to the gap CD shown in FIG. 1A. The etching process used to obtain the H-shaped fin structure 140 herein may be dry etching, but not limited thereto, according to the inventive concept.

In the above embodiment described above in reference to FIGS. 1A through 1E, a method of manufacturing an H-shaped fin structure for a VFET 15 described. However, this method may also apply to manufacturing fin structures having different 2D shapes of character, sign or symbol such as "E," "X," "+", etc. formed of a plurality straight line portions according to embodiments. For example, when a fin structure having the plus sign "+" is formed, a substrate is provided with four rectangular-shaped mandrels having a gap between short sides of thereof and another gap between long sides thereof are formed on a substrate, and a spacer is formed on side surfaces of the mandrels. Further, the etching processes described above may be used to form the fin structure having the plus sign.

As described above, the 2D-shaped fin structure has an advantage in an area thereof compared to the 1D-shaped fin structure in terms of VFET current performance. However, the above embodiment may not be sufficient to obtain a VFET device having a finer 2D-shaped fin structure to achieve a high-density VFET device with VFETs having an improved performance. This is because, while it is desirable to have the fin CD to be less than 10 nm in forming a fin structure for a VFET, the present embodiment may not achieve such dimension for the VFET fin structure because of difficulty in lithographing and etching the mandrels 110-1 and 110-2 having the gap CD of 10 nm or less even by the Extreme Ultra Violet (EUV) lithography and etching. Thus, a different method of manufacturing a VFET fin structure is provided herebelow.

FIGS. 2A through 2F illustrate another method of manufacturing a fin structure for a VFET in the plan view, according to an embodiment. To the extent that the method provided in this embodiment is similar to the method of the previous embodiment, duplicate descriptions may be omitted herebelow.

Figure 2A:
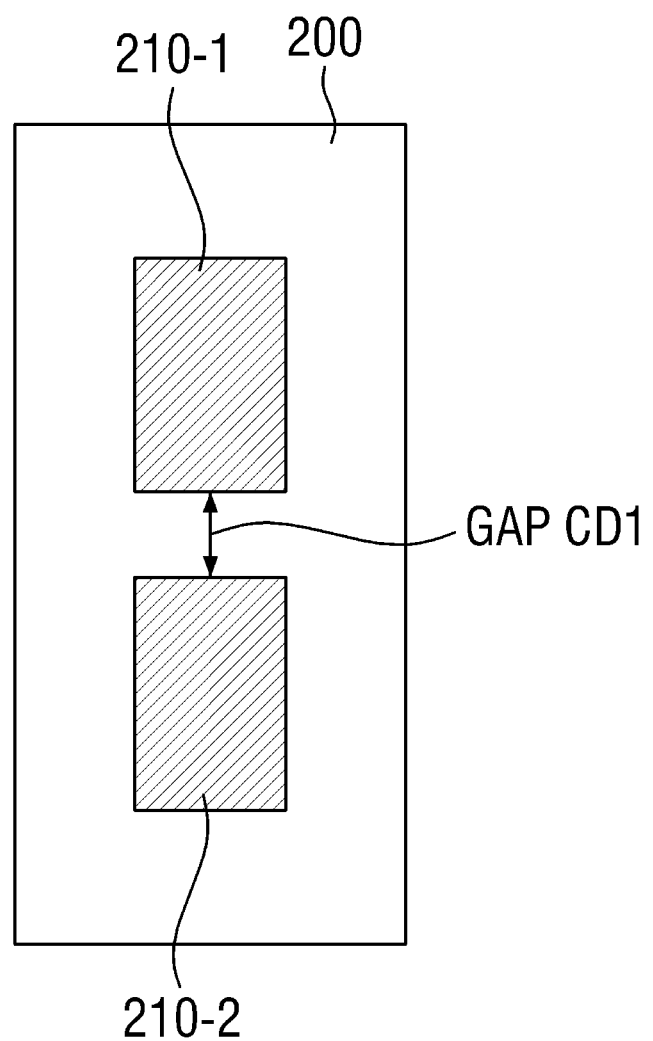
FIGS. 2A through 2F illustrate another method of manufacturing a fin structure for a VFET in the plan view, according to an embodiment.

FIG. 2A shows that, like in FIG. 1A, a substrate 200 is provided with a pair of rectangular-shaped mandrels 210-1 and 210-2 symmetrically formed thereon such that a short side of the mandrel 210-1 faces a short side of the mandrel 210-2 with a first gap having a first critical dimension (hereafter "gap CD1") in the plan view. The gap CD1 represents a width between the two short sides, facing each other, of the mandrels 210-1 and 210-2. However, it is noted that the gap CD1, unlike the gap CD in the previous embodiment, may not define a critical dimension of a fin structure to be formed according to the present embodiment.

Like in the previous embodiment, the shape of the mandrels 210-1 and 210-2 and their symmetric position on the substrate 220 are not limited thereto according to the inventive concept. Thus, the mandrels 210-1 and 210-2 may take a shape different from the rectangle, and may face each other with respect to long sides instead of the short sides thereof, according to an embodiment.

Further, like in the previous embodiment, the mandrels 210-1 and 210-2 may be formed on the substrate 200 through lithographing and etching process so that the mandrels 110-1 and 110-2 may have a protrusion shape protruded from the substrate 200, although a cross-sectional view of the substrate 200 with the mandrels 210-1 and 210-2 thereon is omitted herein. However, different methods may be used to form the mandrels 110-1 and 110-2 according to the inventive concept. There may be provided one or more hard mask layers (not shown) between the substrate 200 and the mandrels 210-1 and 210-2 although not shown in FIGS. 2A through 2F.

Like the substrate 100 in the previous embodiment, the substrate 200 may be formed of a single element semiconductor material such as Si, Ge, etc., not being limited thereto, or their compound (SiGe), and may be doped or not doped. The mandrels 210-1 and 210-2 may also be formed of an SOH material including a silicon-based organic material, not being limited thereto, and various different amorphous silicon materials may be used to form the mandrels 210-1 and 210-2 as long as the mandrels 210-1 and 210-2 have etch selectivity with respect to one or more spacers to be formed on side surfaces, i.e., sidewalls, of the mandrels 210-1 and 210-2 and above the fin structure in following steps of the method according to the present embodiment.

Figure 2B:
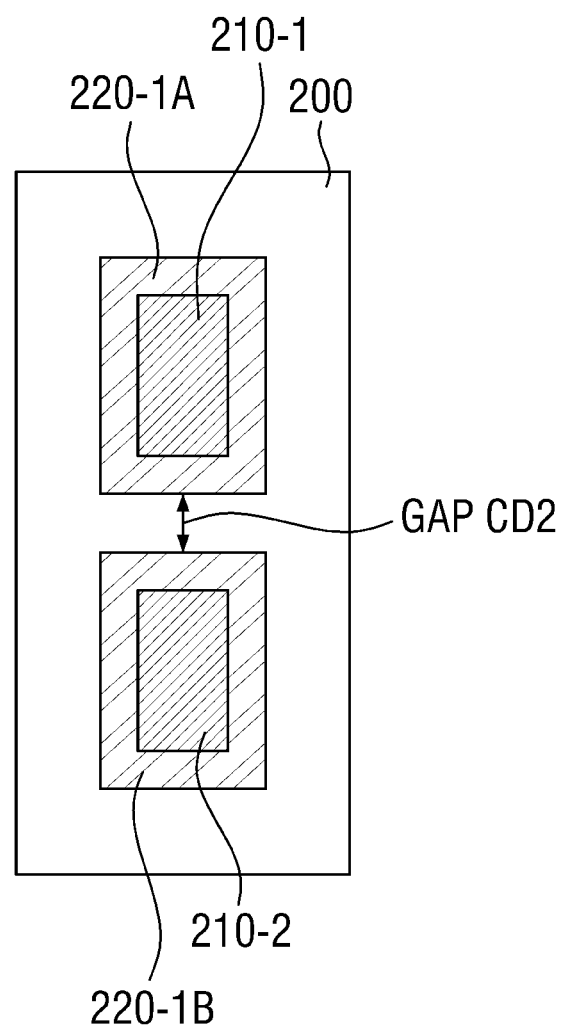

FIG. 2B shows that a first spacer 220-1 is formed on the side surfaces of the mandrels 210-1 and 210-2. Unlike the spacer 120 in the previous embodiment, however, the first spacer 220-1 does not completely fill the first gap having the gap CD1 between the two short sides, facing each other, of the mandrels 210-1 and 210-2. Instead, the first spacer 220-1 includes two first spacers 220-1A and 220-1B formed on the side surfaces of the mandrels 210-1 and 210-2, respectively. Each of the first spacers 220-1A and 220-1B has a connected structure, and the first spacers 220-1A and 220-1B encompasses the mandrels 210-1 and 210-2, respectively. There is provided a second gap having a second critical dimension (hereafter "gap CD2") between the two short sides, facing each other, of the two first spacers 220-1A and 220-1B. This gap CD2 may define the critical dimension of the fin structure to be formed according to the present embodiment.

The first spacers 220-1A and 220-1B may be formed by depositing a spacer material such as SiO on the mandrels 210-1 and 210-2 to cover top surfaces and side surfaces thereof, and etching out the spacer material deposited on the top surfaces to expose the top surfaces and leave the spacer material at the side surfaces of the mandrels 210-1 and 210-2. However, it is noted here that, unlike the spacer 120 in the previous embodiment, the spacer material does not completely fill the gap having the gap CD1 between the mandrels 210-1 and 210-2, and instead, provides the second gap having the gap CD2 which may define the critical dimension of the fin structure to be formed according to the present embodiment.

Like in the previous embodiment, the process of depositing the spacer material may be performed by the thin film deposition technique such as ALD, not being limited thereto, so that the first spacers 220-1A and 220-1B can have a same width along the side surfaces of the mandrels 210-1 and 210-2, respectively. It is noted here that, due to the thin film deposition technique such as ALD, it may be possible to secure the gap CD2, which may be smaller than the gap CD1, to define the fin structure to be formed according to the present embodiment. The etching process used herein to remove the spacer material deposited on the top surfaces of the mandrels 210-1 and 210-2 may be anisotropic etching or plasma etching, not being limited thereto, like in the previous embodiment.

The spacer material forming the first spacer 220-1 may also not be limited SiO as long as this spacer material has etch selectivity with respect to a material forming another spacer to be formed on the first spacer 220-1 and the mandrels 210-1 and 210-2 in a following step of the present embodiment. However, the spacer material forming the first spacer 220-1 may or may not have etch selectively with respect to the material forming the mandrels 210-1 and 210-2 according to the present embodiment.

Figure 2C:
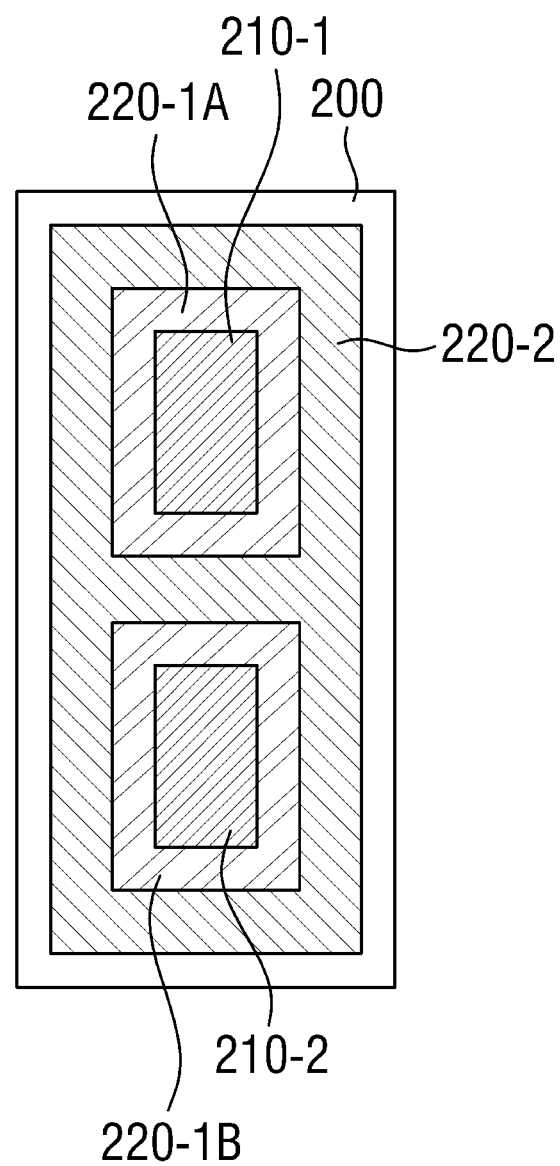

FIG. 2C shows that a second spacer 220-2 is formed on side surfaces of the first spacers 220-1A and 220-1B. FIG. 2C further shows that the second spacer 220-2 fills the gap having the gap CD1 between two short sides, facing each other, of the first spacers 220-1A and 220-1B so that the second spacer 220-2 has a connected structure.

The second spacer 220-2 may be formed by depositing a spacer material such as polysilicon on the mandrels 210-1 and 210-2 and the first spacers 220-1A and 220-1B to cover the top surfaces thereof and side surfaces of the spacers first 220-1A and 220-1B, and etching out the spacer material deposited on the top surfaces to expose the same to the outside and leave the spacer material at the side surfaces of the first spacers 220-1A and 220-1B. It is noted here that the second spacer 220-2 completely fills the gap having the gap CD2 between two short sides, facing each other, of the first spacers 220-1A and 220-1B.

The process of depositing the spacer material to form the second spacer 220-2 may be the same thin film deposition technique such as ALD, not being limited thereto, that was used to form the first spacers 220-1A and 220-1B described above in reference to FIG. 2B so that the second spacer 220-2 can have a same width along the side surfaces of the first spacers 220-1A and 220-1B, which may a required dimension for a desired fin structure to be formed according to the present embodiment. The etching process used in the present stop to remove the spacer material deposited on the top surfaces of the mandrels 210-1 and 210-2 and the first spacers 220-1A and 220-1B may be anisotropic etching or plasma etching, not being limited thereto, used in forming the first spacers 220-1A and 220-1B in reference to FIG. 2B.

The spacer material forming the second spacer 220-2 may not be limited to polysilicon as long as this spacer material has etch selectivity with respect to the material forming the mandrels 210-1 and 210-2 and the spacer material forming the first spacers 220-1A and 220-1B.

Figure 2D:
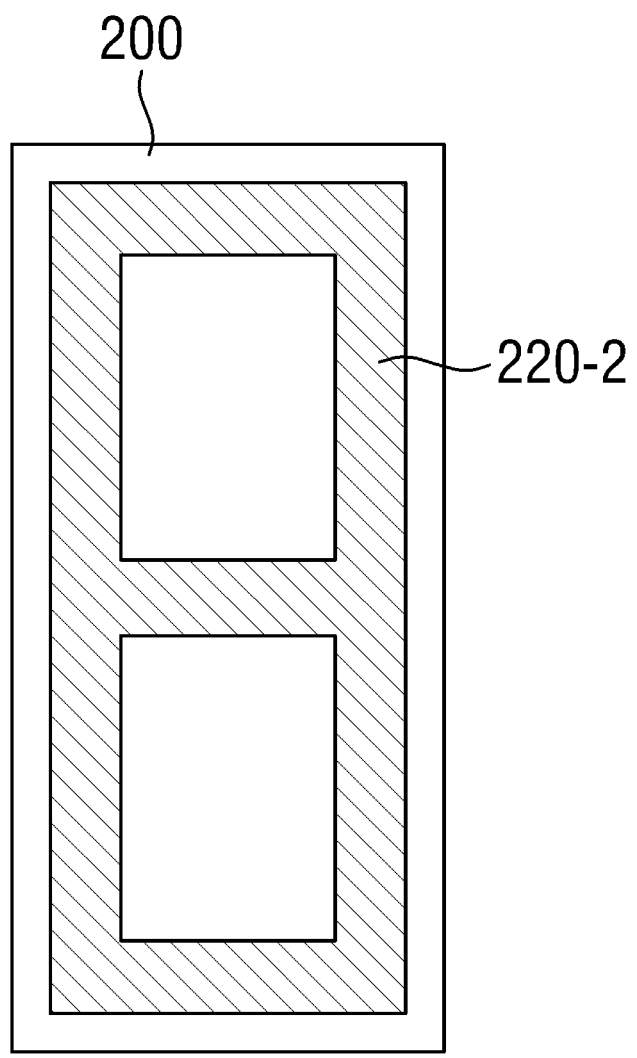

FIG. 2D shows that the mandrels 210-1 and 210-2 and the first spacers 220-1A and 220-1B formed on the side surfaces of the mandrels 210-1 and 210-2 as shown in FIG. 2C are removed by another etching process such as dry etching, not being limited thereto, to leave the second spacer 220-2, formed at the side surfaces of the first spacers 220-1A and 220-1B, on the substrate 100.

Figure 2E:
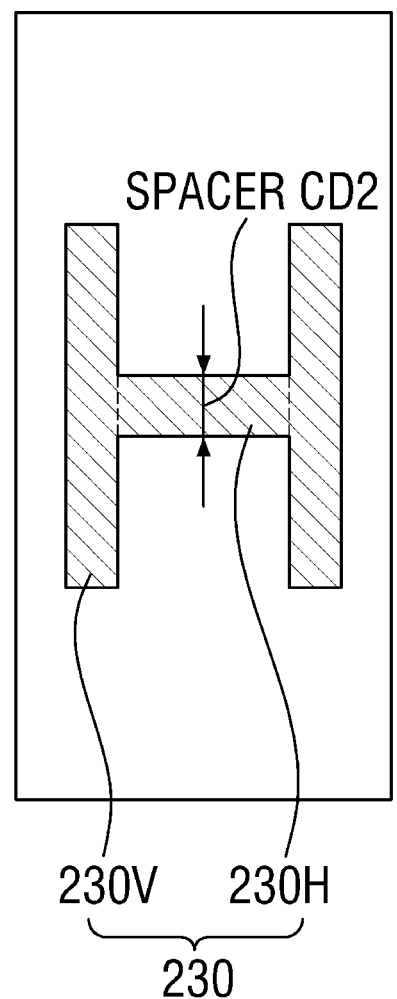

FIG. 2E shows that the second spacer 220-2 is cut or etched out at two opposite sides in a length direction to form an H-shaped spacer 230 similar to the H-shaped spacer 130 in the previous embodiment. This H shape is the same as the shape of the fin structure to be formed herein. It is noted here that the gap CD2 shown in FIG. 2B is transferred to a critical dimension of the H-shaped spacer 230 (hereafter "spacer CD2") because of the lithography, deposition and etching processes shown in FIGS. 2A through 2D. The spacer CD2 represents a width of a horizontal portion 230H of the H-shaped spacer 230, and may be equal to the gap CD2 which will define the critical dimension of the fin structure to be formed in the next step. Further, the width of the horizontal portion 230H of the H-shaped spacer 230 may be equal to a width of a vertical portion 230V of the H-shaped spacer 230.

Figure 2F:
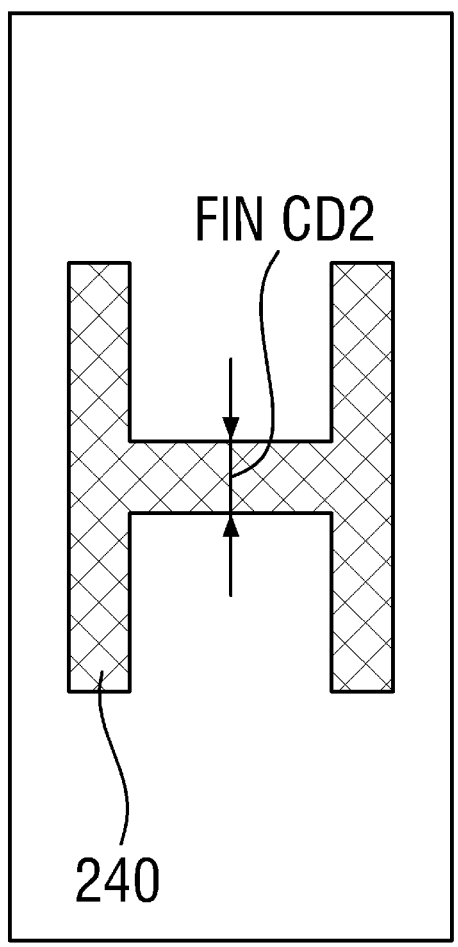

FIG. 2F shows that, using the H-shaped spacer 230 as a hard mask layer, the substrate 200 is etched downward, and the H-shaped spacer 230 is also removed by etching, thereby forming an H-shaped fin structure 240 which is vertical with respect to the substrate 200 and also has a shape of character "H." A bottom S/D region is then formed in the substrate 200 beneath the H-shaped fin structure 240. Here, the spacer CD2 is transferred to a critical dimension of the H-shaped fin structure 240 (hereafter "fin CD2"). Thus, the gap CD2 shown in FIG. 2B is finally transferred to and define the fin CD2. In other words, the fin CD2 of the H-shaped fin structure 240 is equal to the gap CD2 shown in FIG. 2B. The etching process used to obtain the H-shaped fin structure 240 herein may be dry etching, but not limited thereto according to the inventive concept.

In the present embodiment described above in reference to FIGS. 2A through 2F, another H-shaped fin structure for a VFET is manufactured. However, as described in the previous embodiment, the inventive concept may also apply to manufacturing fin structures having different 2D shapes such as characters or symbols "E," "X," "+", etc. according to embodiments.

It is noted here that while the previous embodiment uses one spacer, e.g., spacer 120, to form a fin structure having a 2D shape, e.g., a character H shape, the present embodiment uses two different spacers, e.g., the first spacers 220-1 and 220-2, to form a fin structure having the same 2D shape. Further, while the previous embodiment may not enable to form a fin structure having a critical dimension of 10 nm or less in the plan view because of the difficulty in lithographing and etching a mandrel to have with a smaller gap CD on a substrate, the present embodiment may enable to form such fin structure, thereby to achieve a VFET having an improved performance, as the formation of the first spacer, among the two different spacers, having a smaller gap CD can be possible on the substrate.

In the above embodiment described above in reference to FIGS. 2A through 2F, another method of manufacturing an H-shaped fin structure for a VFET 15 described. However, this method like the method in the previous embodiment may also apply to manufacturing the fin structures having different 2D shapes of character, sign or symbol such as "E," "X," "+", etc. formed of a plurality straight line portions according to embodiments. For example, when a fin structure having the plus sign "+" is formed, a substrate is provided with four rectangular-shaped mandrels having a first gap between short sides thereof and another first gap between long sides thereof are formed on a substrate, and a plurality first spacers are formed on side surfaces of the mandrels with a second gap between short sides thereof and another second gap between long sides thereof. Further, a second spacer is formed on side surfaces of the first spacers to completely fill the second gaps, and the etching processes described above may be used to form the fin structure having the plus sign.

Further, in the above embodiments, an H-shaped fin structure is manufactured using the rectangular-shaped mandrels, each of the mandrels may have a rounded-rectangular shape in which each vertex of the rectangular-shaped mandrels is rounded, and thus, the subsequently-formed spacers may also have the rounded-rectangular shape. Accordingly, a fin structure formed using these mandrels and spacers in the rounded-rectangular shape may have not an exact H shape but a shape of a rounded or deformed H character as described below.

FIGS. 3A through 3F illustrates another method of manufacturing a fin structure for a VFET in the plan view, according to an embodiment.

FIGS. 3A through 3F show that a fin structure 340 having a rounded or deformed H character is formed using a pair of mandrels 310-1 and 310-2 and a pair of first spacers 320-1A and 320-1B each of which has a rounded-rectangular shape. Further, in the present embodiment, a second spacer 320-2 has a shape of two connected rounded rectangles. In addition, like in the previous embodiment, there are provided the same gap CD1 between mandrels 310-1 and 310-2, the same gap CD2 between the first spacers 320-1A and 320-1B, the same spacer CD2, and the same fin CD2.

Figure 3A:
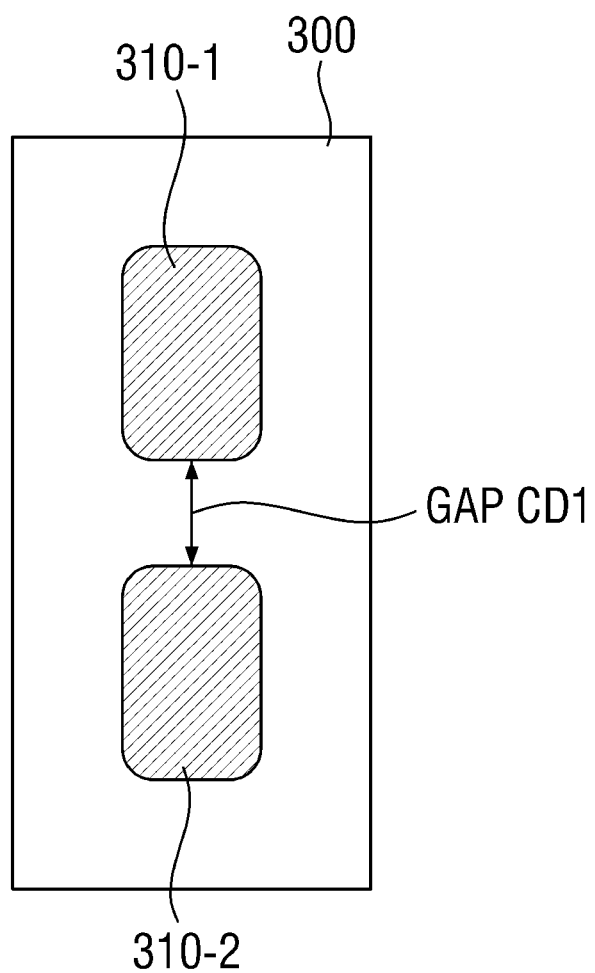
FIGS. 3A through 3F illustrates another method of manufacturing a fin structure for a VFET in the plan view, according to an embodiment.
Figure 3B:
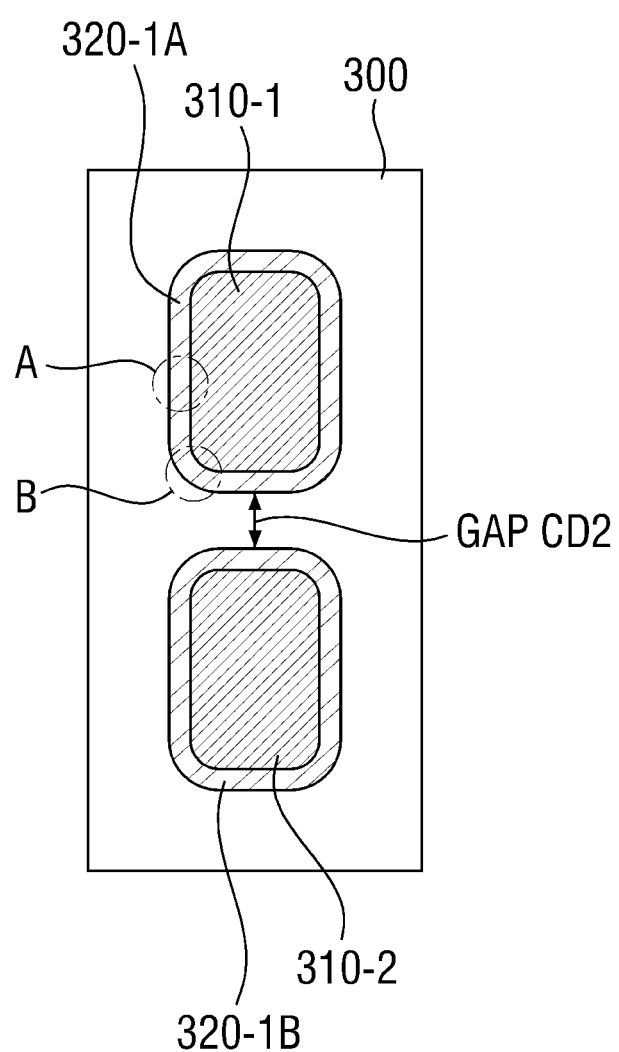
Figure 3C:
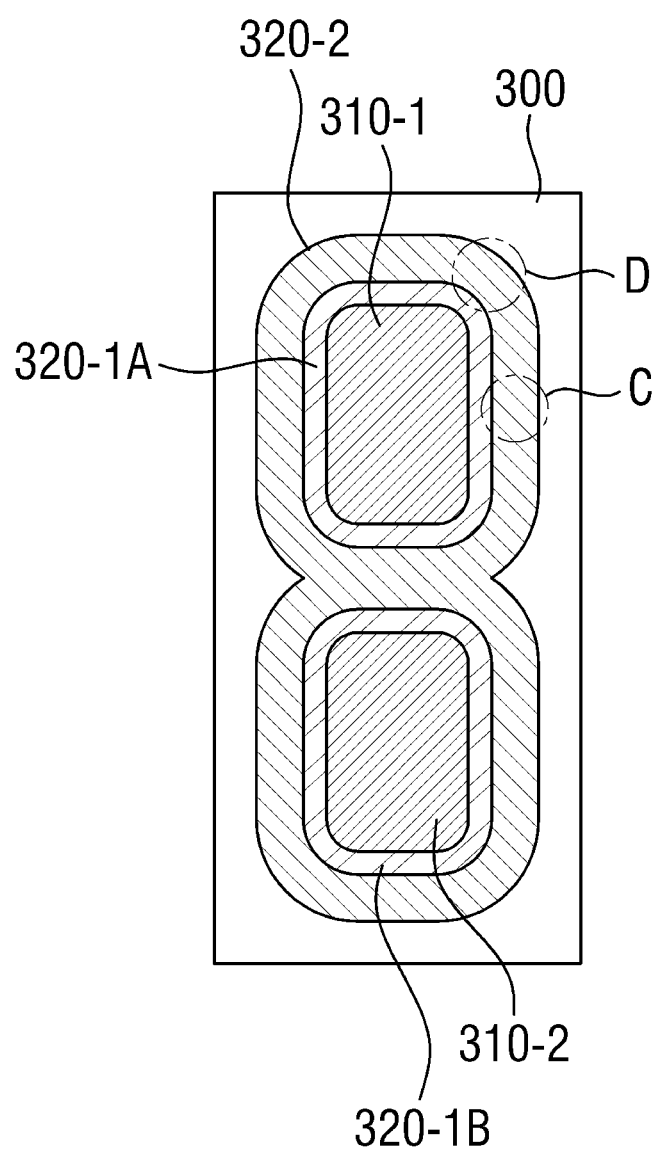
Figure 3D:
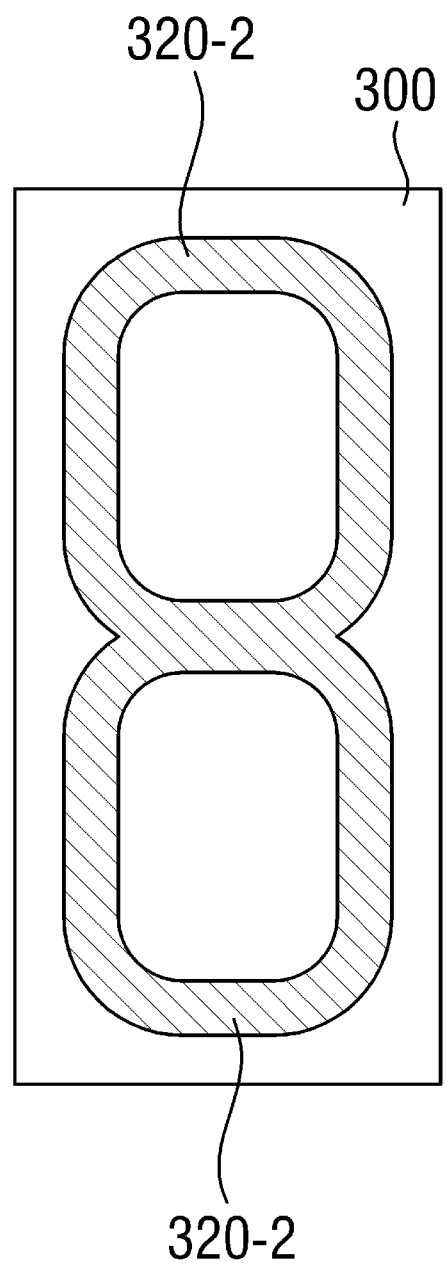
Figure 3E:
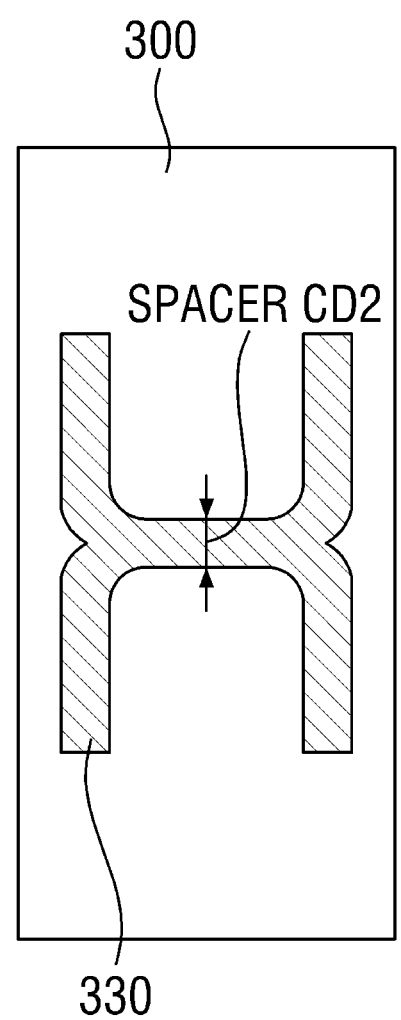
Figure 3F:
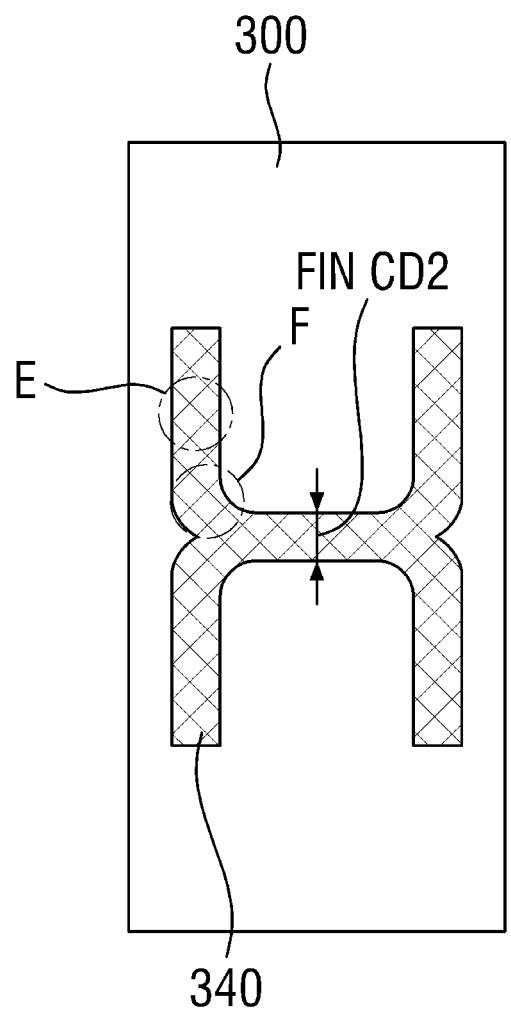

It is noted here that reasons for the rounded-rectangular shape to be formed are that the mandrels 310-1 and 310-2 may take not an exactly rectangular shape but the rounded-rectangular shape when formed on a substrate 300, and the first spacers 320-1A and 320-1B and the second spacer 320-2 are formed by using the thin film deposition technique such as ALD, not being limited thereto, which enables conformal deposition of corresponding materials on side surfaces of the mandrels 310-1, 310-2 and the first spacers 320-1A and 320-1B, respectively. Thus, as shown in FIGS. 3B and 3D, a straight line portion A and a rounded portion B of the first spacer 320-1A may have a same width, and a straight line portion C and a rounded portion D of the second spacer 320-2 may also have a same width which may be equal to a critical dimension of a rounded H-shaped spacer 330, which is subsequently equal to a critical dimension of the rounded H-shaped fin structure 340 in the plan view. Further, a straight line portion E and a rounded portion F of the round H-shaped fin structure 340 as shown in FIG. 3F may have a same width. Therefore, the round H-shaped fin structure 340 may have a better current path performance than the H-shaped fin structure 240.

The materials and processes forming the mandrels 310-1, 310-2, the first spacers 320-1A, 320-1, the second spacer 320-2, the rounded H-shaped spacer 330, and the round H-shaped fin structure 340 may be the same or similar to those in the previous embodiment, and thus, duplicate descriptions are omitted herein.

It is understood that additional steps can be provided before, during, and after the steps described above in reference to FIGS. 1A through 1E, FIGS. 2A through 2F and FIGS. 3A through 3F, one or more steps or parts of the one or more steps described above can be replaced, skipped, eliminated, or moved around for additional embodiments of the inventive concept.

For example, when a fin structure having a shape of the spacer 220-2 is to be formed, the step of FIG. 2E may be skipped, and the process of etching the substrate 200 downward using the H-shaped spacer 230 as a hard mask layer in the step of FIG. 2F may be performed in the step of FIG. 2D. In other words, after the mandrels 210-1 and 210-2 and the spacers 220-1A and 220-1B are removed, the substrate 200 may be etched downward using the spacer 220-2 as a hard mask layer before the spacer 220-2 is removed to form the fin structure having the shape of the spacer 220-2. This method may apply when a fin structure having a different 2D shape such as a plus sign "+" is formed using four mandrels on a substrate.

The foregoing is illustrative of exemplary embodiments and is not to be construed as limiting thereof. Although a few exemplary embodiments have been described, those skilled in the art will readily appreciate that many modifications are possible in the above embodiments without materially departing from the inventive concept.

What is claimed is:

1. A method for manufacturing a fin structure for a vertical field effect transistor (VFET), the method comprising:
    forming a plurality of mandrels on a substrate, the mandrels having at least one first gap therebetween;
    forming a plurality of first spacers on side surfaces of the mandrels, respectively, such that at least one second gap, which is smaller than the first gap, is formed between the first spacers;
    forming a second spacer on side surfaces of the first spacers;
    removing the mandrels and the first spacers to leave the second spacer formed on the side surfaces of the first spacers;
    removing the second spacer, formed on the side surfaces of the first spacers, at a predetermined portion so that the remaining second spacer has a same two-dimensional (2D) shape as the fin structure; and
    removing a portion of the substrate, except below the remaining second spacer, and the remaining second spacer so that the substrate below the remaining second spacer forms the fin structure.

2. The method of claim 1, wherein the second gap is equal to a width of the second spacer at a portion formed on a side surface among the side surfaces of the first spacers, and
    wherein the second gap is equal to a width of the substrate at the portion below the remaining second spacer forming the fin structure.

3. The method of claim 2, wherein the forming the first spacer on the side surfaces is performed by atomic layer deposition (ALD).

4. The method of claim 1, wherein the forming the second spacer of the side surfaces of the first spacers is performed such that a width of the second spacer is the same along the side surfaces of the first spacers including the second gap, and the second gap is completely filled with the second spacer.

5. The method of claim 1, wherein the removing the portion of the substrate except below the remaining second spacer comprises etching the portion of the substrate, except below the remaining second spacer, downward using the remaining second spacer as a hard mask layer.

6. The method of claim 1, wherein the forming the first spacers on the side surfaces of the mandrels comprises:
    forming the first spacers on top and the side surfaces of the mandrels; and
    etching the first spacers at a portion on the top surfaces of the mandrels so that the first spacers at the other portion are left at the side surfaces of the mandrels, and the top surfaces of the mandrels are exposed to an outside.

7. The method of claim 6, wherein the forming the second spacer on the side surfaces of the first spacers comprises:
    forming the second spacer on the top surfaces of the mandrels and top and the side surfaces of the first spacers; and
    etching the second spacer at a portion on the top surfaces of the mandrels and the top surfaces of the first spacers so that the second spacer at the other portion is left at the side surfaces of the first spacers.

8. The method of claim 7, wherein the second spacer is formed of a material having etch selectively against materials forming the mandrels and the first spacers.

9. The method of claim 8, wherein materials forming the second spacer, the first spacers and the mandrels, respectively, have etch selectively against one another.

10. The method of claim 9, wherein the material forming the mandrels comprises a spin-on-hard mask (SOH) material comprising a silicon-based organic material,
wherein the material forming the first spacers comprises silicon oxide, and
wherein the material forming the second spacer comprises polysilicon.

11. The method of claim 1, wherein the second spacer comprises a plurality of straight line portions having a same width.

12. The method of claim 11, wherein the second gap is equal to the same width.

13. The method of claim 1, wherein each of the mandrels has a rounded-rectangular shape,
wherein the first spacers are formed conformally on the side surfaces of the mandrels such that the first spacers have a same width in a plan view, and
wherein the second spacer is formed conformally on the side surfaces of the first spacers such that the second spacer has a same width both at a rounded corner portion and at a straight line portion.

14. A method for manufacturing a fin structure for a vertical field effect transistor (VFET), the method comprising:
forming a plurality of mandrels on a substrate, the mandrels having at least one first gap therebetween;
forming a plurality of first spacers on side surfaces of the mandrels, respectively, such that at least one second gap, which is smaller than the first gap, is formed between the first spacers;
forming a second spacer on side surfaces of the first spacers;
removing the mandrels and the first spacers to leave the second spacer, and removing a portion of the substrate except below the second spacer, using the second spacer as a hard mask layer; and
removing the second spacer so that the substrate below the second spacer forms the fin structure.

15. The method of claim 14, wherein the second gap is equal to a width of the second spacer formed on a side surface among the side surfaces of the first spacers.

16. The method of claim 14, wherein each of the mandrels has a rounded-rectangular shape,
wherein the first spacers are formed conformally on the side surfaces of the mandrels such that the first spacer has one same width in a plan view, and
wherein the second spacer is formed conformally on the side surfaces of the first spacers such that the second spacer has a same width both at a rounded portion and at a straight line portion in a plan view.

* * * * *